United States Patent
Okumura et al.

(10) Patent No.: US 6,770,522 B2
(45) Date of Patent: Aug. 3, 2004

(54) SEMICONDUCTOR DEVICE AND MANUFACTURING METHOD THEREOF

(75) Inventors: Yoshinori Okumura, Tokyo (JP); Shuichi Ueno, Tokyo (JP); Haruo Furuta, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/444,959

(22) Filed: May 27, 2003

(65) Prior Publication Data

US 2004/0092063 A1 May 13, 2004

(30) Foreign Application Priority Data

Nov. 12, 2002 (JP) ........................................ 2002-327766

(51) Int. Cl.[7] .......................................... H01L 21/8238
(52) U.S. Cl. ...................... 438/199; 438/230; 438/231
(58) Field of Search ................................ 257/382, 383, 257/384, 318, 326, 412, 335, 336, 344; 438/159, 200, 230, 231, 232, 285, 290

(56) References Cited

U.S. PATENT DOCUMENTS 5,656,841 A * 8/1997 Watanabe et al. ........... 257/318

FOREIGN PATENT DOCUMENTS

| JP | 2000-353803 | 12/2000 |
| JP | 2002-231821 | 8/2002 |

OTHER PUBLICATIONS

K. Imai, et al., IEDM, pp. 455–458, "CMOS Device Optimization for System–On–A–Chip Applications", 2000.
H. Watanabe, et al., IEDM, pp. 975–978, "Novel 0.44$\mu m^2$ Ti–Salicide STI Cell Technology for High–Density NOR Flash Memories and Performace Embedded Application" 1998.

* cited by examiner

Primary Examiner—Wael Fahmy
Assistant Examiner—Hoai Pham
(74) Attorney, Agent, or Firm—Oblon, Spivak, McClelland, Maier & Neustadt, P.C.

(57) ABSTRACT

A semiconductor device and a manufacturing method thereof which is suited for forming both a transistor for a memory cell and a transistor for a high voltage circuit part on one semiconductor substrate, and moreover, has little deterioration of an electric characteristic in the structure that a sidewall insulating film in a shared contact plug part is removed is provided. An active layer is formed by performing an additional impurity injection on a part where a sidewall insulating film is removed in a forming portion of a shared contact plug. An insulating film is laminated in a high voltage circuit part and a sidewall insulating film of wide width is formed. According to this, a forming width of a sidewall insulating film can be made small in a MOS transistor for a memory cell part, and a forming width of a sidewall insulating film can be made large in a MOS transistor for a high voltage circuit part. Thereupon, in the high voltage circuit part, a source/drain active layer can be formed in the position more distant from a gate electrode.

1 Claim, 13 Drawing Sheets

SEMICONDUCTOR DEVICE AND MANUFACTURING METHOD THEREOF

BACKGROUND OF THE INVENTION

1. Field of the Invention

The present invention relates to a semiconductor device which includes MOS (Metal Oxide Semiconductor) transistors, wirings etc. and a manufacturing method thereof.

2. Description of the Background Art

Conventionally, a semiconductor device which includes MOS transistors, wirings etc. is manufactured by performing an impurity injection in a semiconductor substrate and forming an insulating film and a conductive film on a surface of the semiconductor substrate.

Information of conventional art documents which relates to the invention of the present application is described below.

Japanese Patent Application Laid-Open No. 2000-353803

Japanese Patent Application Laid-Open No. 2002-231821

K. Imai et al., "CMOS device optimization for system-on-a-chip applications", (U.S.A.). IEDM, 2000. p. 455–458

H. Watanabe et al., "Novel 0.44 $\mu m^2$ Ti-Salicide STI Cell Technology for high-Density NOR Flash Memories and Performance Embedded Application", (U.S.A.). IEDM, 1998. p. 975–976

It is general that an active layer which becomes a source/drain region of a MOS transistor is composed of an extension region and a region whose impurity concentration is higher than that of the extension region. The high impurity concentration region is formed by forming a sidewall insulating film on a side of a gate electrode after forming the extension region and performing an impurity injection with the gate electrode and the sidewall insulating film as a mask. Thus, a position where the high impurity concentration region is formed is determined by a forming width of the sidewall insulating film in a channel direction of the transistor.

Generally, with regard to a MOS transistor which is used for a memory cell in a SRAM (Static Random Access Memory) etc., the high impurity concentration region is widely formed so that it is distributed close to the gate electrode. It is performed by reason of reducing a resistance value in the source/drain region. Therefore, the forming width of the sidewall insulating film is arranged to be a small value.

In the meantime, with regard to a MOS transistor which is used for a high voltage circuit part, the high impurity concentration region is formed distant from the gate electrode as compared with a case of the MOS transistor for the memory cell. It is because, with regard to the high voltage circuit part, it is desirable that the high impurity concentration region is distant from the gate electrode to prevent a phenomenon, that is so-called GIDL (Gate Induced Drain Leakage) generation (a phenomenon that when a high voltage is applied to a gate, atoms which are stably existent in a drain region separates into holes and electrons, and thus a leakage current flows between a drain and a substrate). Therefore, the forming width of the sidewall insulating film is arranged to be a large value.

In the meantime, there is a case that both the MOS transistor for the memory cell and the MOS transistor for the high voltage circuit part are formed on one semiconductor substrate. In this case, it is general that both types of the MOS transistors are formed in the same step without adding the number of steps, and the forming widths of the sidewall insulating films are determined to be identical. In other words, the forming width of the sidewall insulating film is arranged to be a value fitting to either of the MOS transistors. Generally, in order to give priority to preventing a drain voltage breakdown in the high voltage circuit part, the forming width of the sidewall insulating film is determined to suit to the MOS transistor for the high voltage circuit part.

However, essentially as described above, it is desirable to make small the forming width of the sidewall insulating film in the MOS transistor for the memory cell and make large the forming width of the sidewall insulating film in the MOS transistor for the high voltage circuit part.

Moreover, there is a case that the active layer such as the source/drain region etc. which is formed by performing the impurity injection into the semiconductor substrate and the wiring which is formed near the active layer on the semiconductor substrate are short-circuited by a shared contact plug. In that time, as described in FIG. 23 of the patent document No. 2000-353803, there is a case that the sidewall insulating film formed on a side of the wiring is removed.

When the sidewall insulating film is removed as described above, a problem arises as described below. In other words, under the sidewall insulating film, the active layer has a low impurity concentration caused by a low injection rate of the impurity, and thus a value of a contact resistance between that part of the active layer and the shared contact plug is liable to become high. Moreover, a part of the semiconductor substrate which is under the sidewall insulating film is liable to be damaged caused by an etching when the sidewall insulating film is removed, therefore, a PN junction between the active layer and the semiconductor substrate is not definitely formed, and a junction leakage current often increases.

SUMMARY OF THE INVENTION

It is an object of the present invention to provide a semiconductor device and a manufacturing method thereof which is suited for forming both a transistor for a memory cell and a transistor for a high voltage circuit part on one semiconductor substrate, and moreover, has little deterioration of an electrical characteristic in the structure that a sidewall insulating film in a shared contact plug part is removed.

According to the first aspect of the present invention, a manufacturing method of a semiconductor device includes the following steps (a) to (f).

(a) A conductive film is formed on a semiconductor substrate.

(b) The conductive film is patterned by a photolithography technique and an etching technique.

(c) A first active layer is formed by performing an impurity injection in proximity of the patterned conductive film in a surface of the semiconductor substrate.

(d) An interlayer insulating film is formed on a surface of the semiconductor substrate.

(e) A contact hole in which both the first active layer and the conductive film are exposed is formed in the interlayer insulating film by a photolithography technique and an etching technique.

(f) A second active layer is formed by performing an impurity injection on a surface of the semiconductor substrate which is exposed in the contact hole.

The contact hole in which both the first active layer and the conductive film are exposed is formed, and the second active layer is formed on the surface of the semiconductor substrate which is exposed in the contact hole. By reason of forming the second active layer, when a conductive substance is filled in the contact hole and a shared contact plug which conducts to both the first active layer and the conductive film is formed, a contact resistance between the shared contact plug and the first active layer can be reduced than ever.

According to the second aspect of the present invention, a semiconductor device includes a semiconductor substrate, a first transistor and a second transistor.

The first transistor includes a first gate electrode which is formed on the semiconductor substrate, a first sidewall insulating film which is formed on a side of the first gate electrode on the semiconductor substrate and first source/drain active layers which are formed in the semiconductor substrate.

The second transistor includes a second gate electrode which is formed on the semiconductor substrate, a second sidewall insulating film which is formed on a side of the second gate electrode on the semiconductor substrate and second source/drain active layers which are formed in the semiconductor substrate.

Layers of an insulating film which composes the second sidewall insulating film are more in number than layers of an insulating film which composes the first sidewall insulating film, and accordingly, a width of the second sidewall insulating film in a channel direction of the second transistor is larger than a width of the first sidewall insulating film in a channel direction of the first transistor.

By reason that the width of the second sidewall insulating film is larger than the width of the first sidewall insulating film, in the second transistor, the source/drain active layer can be formed in the position more distant from the gate electrode as compared with the first transistor. Thus, while using the second transistor for a high voltage circuit part and the first transistor for a memory cell, a semiconductor device which is suited for forming both the transistor for the memory cell and the transistor for the high voltage circuit part on one semiconductor substrate can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

The present preferred embodiment is a manufacturing method of a semiconductor device that an additional impurity injection on a part where a sidewall insulating film is removed in a shared contact plug forming portion is performed. With regard to the manufacturing method of the semiconductor device according to the present preferred embodiment, an insulating film is laminated in a high voltage circuit part and a sidewall insulating film of wide width is formed. According to this, a forming width of a sidewall insulating film is made small in a MOS transistor for a memory cell, and a forming width of a sidewall insulating film is made large in a MOS transistor for the high voltage circuit part.

FIGS. 1 to 7 are drawings all illustrating a manufacturing method of a semiconductor device according to the present preferred embodiment. The present preferred embodiment is described below using these drawings.

Figure 1:
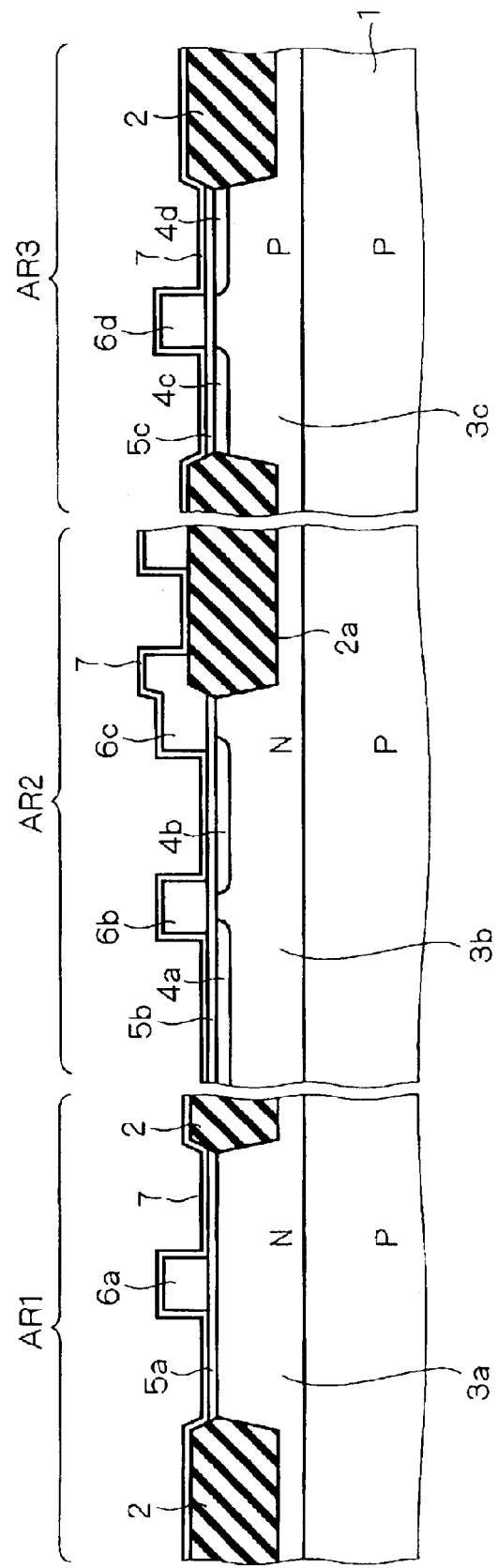
FIGS. 1 to 7 are drawings all illustrating a manufacturing method of a semiconductor device according to the first preferred embodiment.

At first, with reference to FIG. 1, a semiconductor substrate 1 such as a silicon substrate etc. which is separated into a high voltage circuit part AR1, a memory cell part AR2 and a memory cell peripheral circuit pan AR3 is prepared. A P type impurity ion such as Boron etc. is injected in the whole of the semiconductor substrate 1.

Next, element isolation regions 2 and 2a to isolate each element are formed on each certain region of a surface of the semiconductor substrate 1. The element isolation regions 2 and 2a are formed of an insulating film such as a silicon oxide film etc. Then, in each part of the high voltage circuit part AR1, the memory cell part AR2 and the memory cell peripheral circuit part AR3, the P type impurity ion such as Boron etc. is injected in the region where a N channel type MOS transistor is to be formed, and a N type impurity ion such as phosphorus, arsenic etc. is injected in the region where a P channel type MOS transistor is to be formed. According to this, N type wells 3a and 3b and a P type well 3c are formed in each region.

With regard to the injection of the impurity ion, with patterning a photo resist into a desired shape by a photolithography technique, an ion injection can be performed to the desired portion with the patterned photo resist as a mask. The same may be said of the injection of the other impurity ions described below.

Moreover, in FIGS. 1 to 7, for a simplification of drawings, only a part of the N type wells are illustrated in the high voltage circuit part AR1 and the memory cell part AR2, and only a part of the P type well is illustrated in the memory cell peripheral circuit part AR3. However, as a matter of course, the P type wells are also formed in the high voltage circuit part AR1 and the memory cell part AR2, and the N type well is also formed in the memory cell peripheral circuit part AR3. Further, the N channel MOS transistor can be formed on the P type well and the P chancel MOS transistor can be formed on the N type well.

Next, gate insulating films 5a to 5c are formed by a thermal oxidation treatment on a surface of the semiconductor substrate 1 except for the forming part of the element isolation regions 2 and 2a. Afterwards, a conductive film such as a polysilicon film etc. is formed on the entire surface of the semiconductor substrate 1 by a CVD (Chemical Vapor Deposition) method, for example, and is patterned into a desired shape by a photolithography technique and an etching technique. According to this, gate electrodes 6a, 6b and 6d and a wiring 6c are formed. Although the wiring 6c has a shape which is partly run upon the element isolation region 2a, as a matter of course, it is not necessary to make it shape like this.

Moreover, prior to patterning the polysilicon film described above, in the polysilicon film, the P type impurity ion has to be injected only in a part to be the gate electrode and the wiring on the P type well, and the N type impurity ion has to be injected only in a part to be the gate electrode and the wiring on the N type well. Then, the gate electrodes 6a and 6b and the wiring 6c become an N+ doped polysilicon gate and the gate electrode 6d becomes a P+ doped polysilicon gate.

Next, in the memory cell part AR2 and the memory cell peripheral circuit part AR3, extension regions 4a to 4d are formed with the element isolation regions 2 and 2a, the gate electrodes 6b and 6d and the wiring 6c as the masks. More particularly, in both regions, P⁻ extension regions 4a and 4b are formed by injecting the P type impurity ion in the forming region of the P channel MOS transistor. In the meantime, N⁻ extension regions 4c and 4d are formed by injecting the N type impurity ion in the forming region of the N channel MOS transistor. In this step, the photo resist is formed on the entire surface of the high voltage circuit part AR1 and the injection of the impurity ion in the high voltage circuit part AR1 is prevented.

Further, a silicon oxide film 7 is formed over the entire surface of the semiconductor substrate 1 so as to cover the semiconductor substrate 1, the gate electrodes 6a, 6b and 6d and the wiring 6c by the CVD method, for example.

Figure 2:
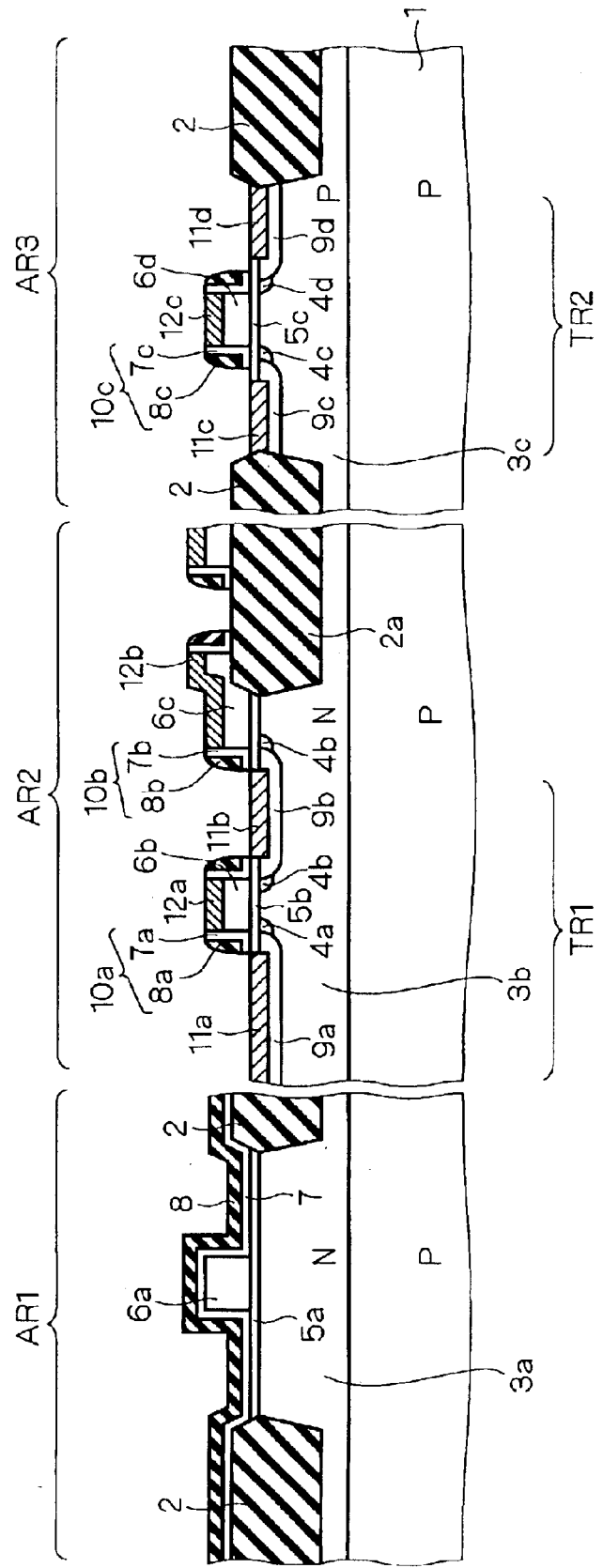

Next, with reference to FIG. 2, a silicon nitride film 8 is furthermore formed on the silicon oxide film 7 over the entire surface of the semiconductor substrate 1 so as to cover the semiconductor substrate 1, the gate electrodes 6a, 6b and 6d and the wiring 6c by the CVD method, for example.

The reason why the silicon oxide film 7 is formed under the silicon nitride film 8 is that a stress which the silicon nitride film 8 exerts on the semiconductor substrate 1 is relaxed. Accordingly, the silicon oxide film 7 is not essential, however, it is desirable to form it to prevent a deterioration of a device characteristic.

Further, an etch-back is performed to the silicon nitride film 8 and the silicon oxide film 7 selectively in the memory cell part AR2 and the memory cell peripheral circuit part AR3. According to this, in both regions, a sidewall insulating film 10a which includes a silicon nitride film 8a and a silicon oxide film 7a, a sidewall insulating film 10b which includes a silicon nitride film 8b and a silicon oxide film 7b and a sidewall insulating film 10c which includes a silicon nitride film 8c and a silicon oxide film 7c are formed. In this step, the photo resist is formed on the entire surface of the high voltage circuit part AR1 and the formation of the sidewall insulating film in the high voltage circuit part AR1 is prevented.

Further, an impurity injection is performed with the gate electrodes 6b and 6d, the wiring 6c and the sidewall insulating films 10a to 10c as the masks selectively in the memory cell part AR2 and the memory cell peripheral circuit part AR3. According to this, source/drain active layers 9a to 9d are formed in the semiconductor substrate 1, and a transistor TR1 for the memory cell and a transistor TR2 for the memory cell peripheral circuit are formed.

More particularly, in both regions, P+ source/drain active layers 9a and 9b are formed by injecting the P type impurity ion in the forming region of the P channel MOS transistor after forming the sidewall insulating films 10a and 10b. In the meantime, N+ source/drain active layers 9c and 9d are formed by injecting the N type impurity ion in the forming region of the N channel MOS transistor after forming the sidewall insulating film 10c. Also in this step, the photo resist is formed on the entire surface of the high voltage circuit part AR1 and the formation of the source/drain active layer in the high voltage circuit part AR1 is prevented.

Further, a metal film such as Ti and Co is formed on the entire surface of the semiconductor substrate 1 by a sputtering method, for example, and furthermore, a TiN film is formed on it by the sputtering method, for example.

Further, silicide layers 11a to 11d and 12a to 12c are respectively formed on the gate electrodes 6b and 6d, the wiring 6c and the source/drain active layers 9a to 9d by performing an annealing treatment in a nitride atmosphere and making the metal film and the TiN film react to a silicon material. Afterwards, the unreacted metal film and TiN film are removed selectively. Also in this step, the photo resist is formed on the entire surface of the high voltage circuit part AR1 and the formation of the silicide layer in the high voltage circuit part AR1 is prevented.

The reason why the TiN film is formed on the metal film is that an excessive silicidation of the metal film such as Ti and Co is suppressed. When the TiN film is not formed, the silicidation of the metal film such as Ti and Co is proceeded excessively, and thus the silicide layers 11a to 11d and 12a to 12c are liable to be formed thick.

Figure 3:
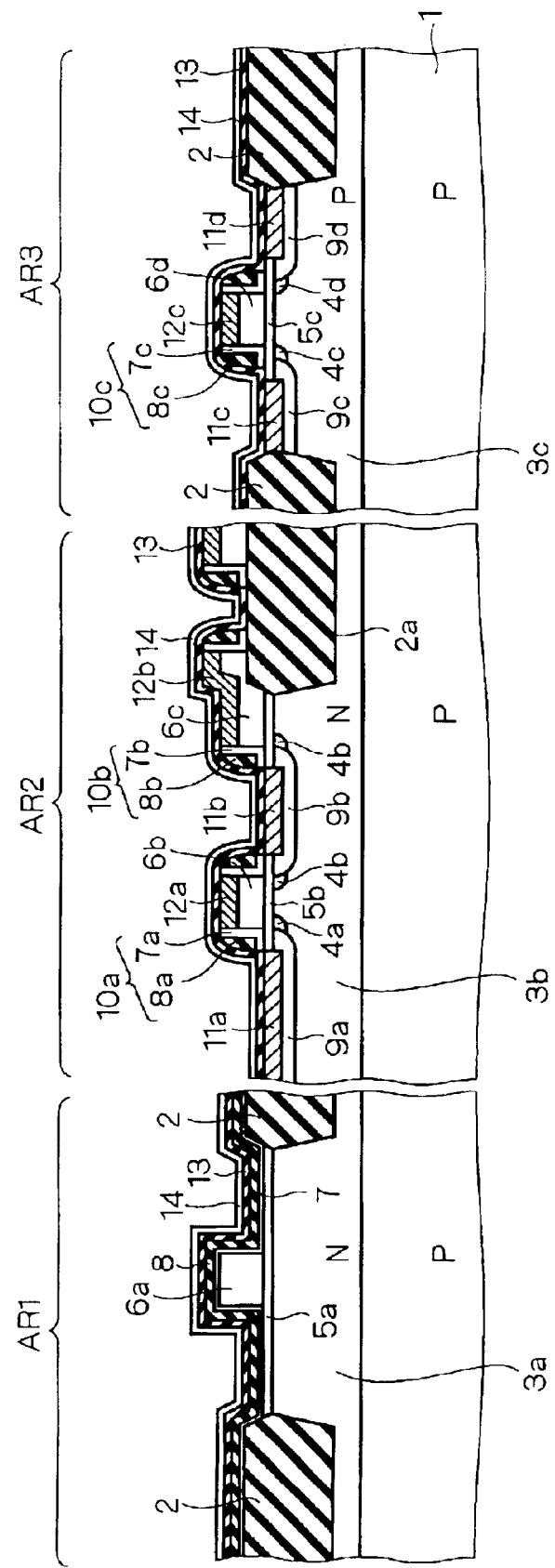

Next, with reference to FIG. 3, a silicon nitride film 13 and a silicon oxide film 14 are formed respectively laminating over the entire surface of the semiconductor substrate 1 so as to cover the silicon nitride film 8 in the high voltage circuit part AR1, and the entire surface of the memory cell part AR2 and the memory cell peripheral circuit part AR3 by the CVD method, for example.

The reason why the silicon nitride film 13 is formed under the silicon oxide film 14 is that in the memory cell part AR2 and the memory cell peripheral circuit part AR3, the silicon nitride film is used as an etching stopper when an interlayer insulating film is formed and a contact hole is opened afterwards. Accordingly, the silicon nitride film 13 is not essential, however, it is desirable to form it by reason of benefit under the manufacturing process.

Figure 4:
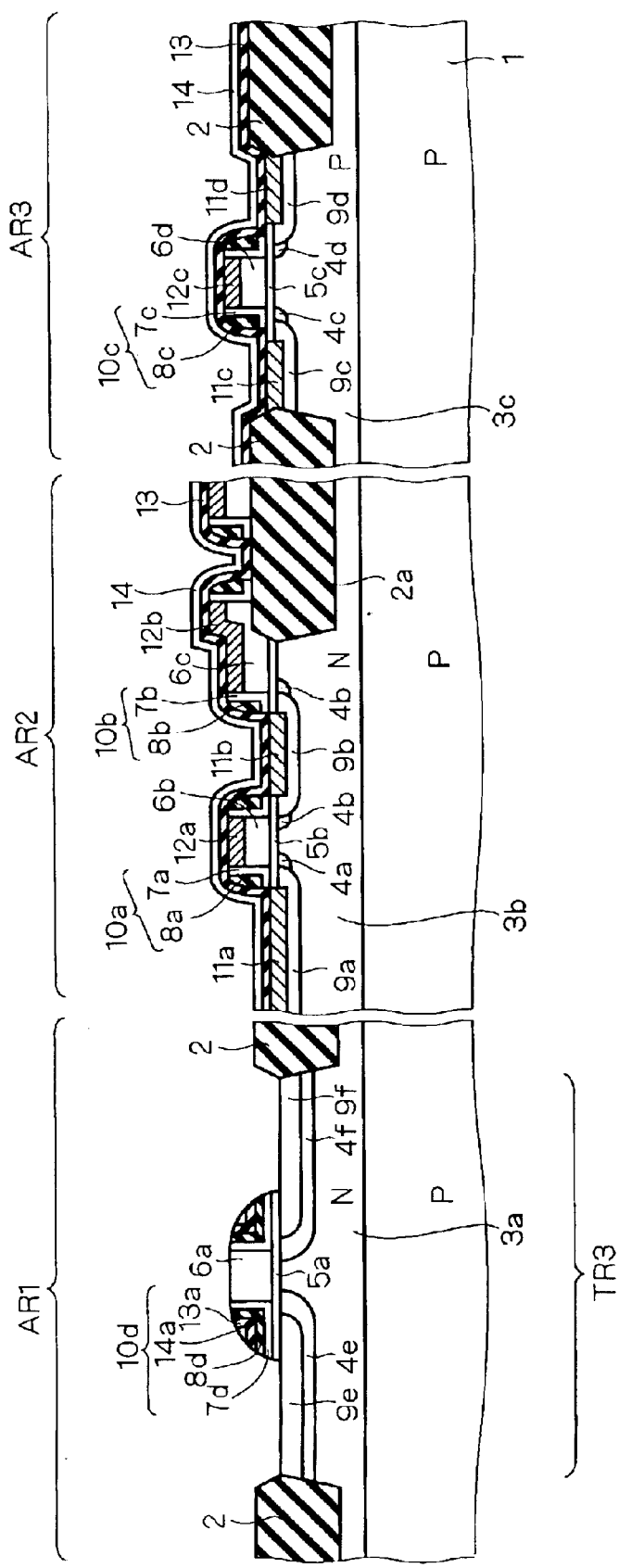

Further, an etch-back is performed to a laminating structure of the silicon oxide film 7, the silicon nitride film 8, the silicon nitride film 13 and the silicon oxide film 14 selectively in the high voltage circuit part AR1. According to this, as shown in FIG. 4, a sidewall insulating film 10d which includes the silicon oxide film 7d, the silicon nitride film 8d and 13a and the silicon oxide film 14a is formed on a side of the gate electrode 6a. In this step, the photo resist is formed on the entire surface of the memory cell part AR2 and the memory cell peripheral circuit part AR3, and in the memory cell part AR2 and the memory cell peripheral circuit part AR3, the etch-back to the silicon nitride film 13 and the silicon oxide film 14 is prevented.

Further, the impurity injections by two stages are performed with the gate electrode 6a and the sidewall insulating film 10d as the mask selectively in the high voltage circuit part AR1. In other words, both the formation of the extension region and the formation of the source/drain active layer are performed. According to this, a transistor TR3 for the high voltage circuit part is formed in the semiconductor substrate 1.

More particularly, in the high voltage circuit part AR1, P⁻ extension regions 4e and 4f are formed by injecting the P type impurity ion in the forming region of the P channel MOS transistor. Afterwards, P+ source/drain active layers 9e and 9f are formed within the forming region of the P⁻ extension regions 4e and 4f by the injection of the P type impurity ion whose concentration is raised. The N channel MOS transistor is not shown in the high voltage circuit part AR1, however, in the same manner as the case of the P channel MOS transistor, the injection of the N type impurity ion by two stages can be performed with the gate electrode and the sidewall insulating film as the mask.

Also in this step, the photo resist is formed on the entire surface of the memory cell part AR2 and the memory cell peripheral circuit part AR3, and in the memory cell part AR2 and the memory cell peripheral circuit part AR3, the formation of the extension region and the source/drain active layer is prevented.

With regard to the MOS transistor in the high voltage circuit part AR1, the formation of the silicide layer on the gate electrode and the source/drain active layer is not performed, however, the reason for this is that an occurrence of a leakage current caused by the formation of the silicide layer is prevented.

Figure 5:
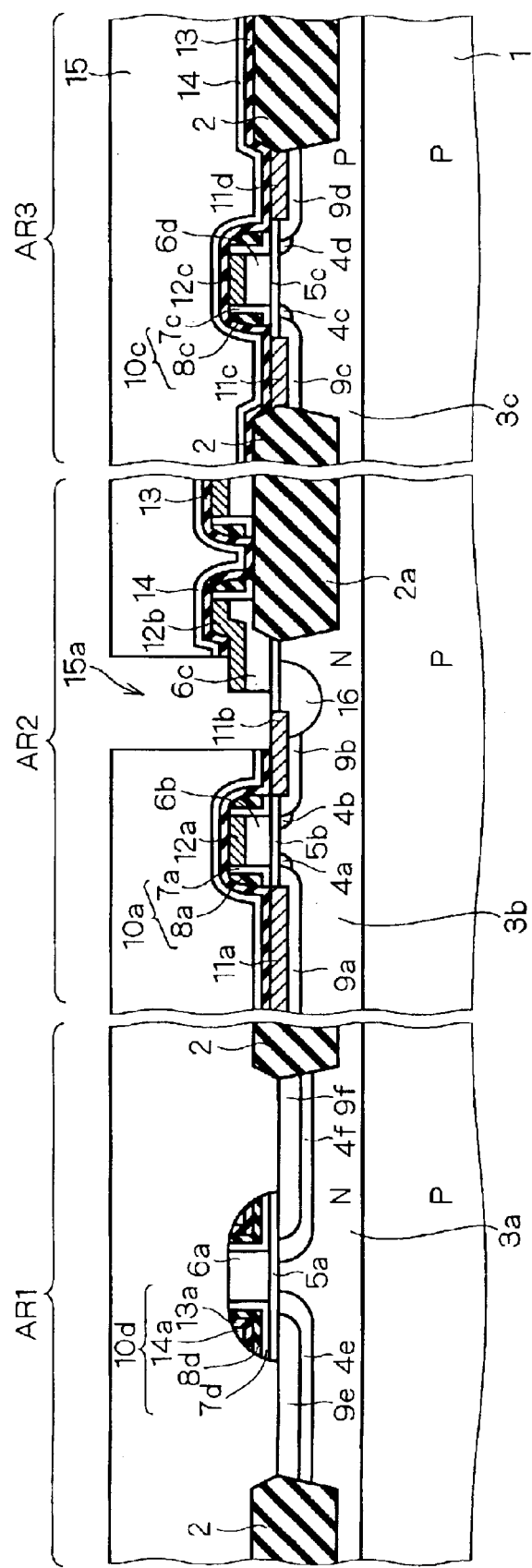

Next, with reference to FIG. 5, an interlayer insulating film 15 which is composed of, for example, the silicon oxide film on the surface of the semiconductor substrate 1 is formed by the CVD method. A surface of the interlayer insulating film 15 is flattened by a CMP (Chemical Mechanical Polishing) process etc.

In the meantime, with regard to the present preferred embodiment, the $P^+$ source/drain active layer 9b and the wiring 6c are short-circuited by a shared contact plug in the memory cell part AR2. For that purpose, a contact hole 15a in which both the $P^+$ source/drain active layer 9b and the wiring 6c is exposed is formed in the interlayer insulating film 15 by the photolithography technique and the etching technique.

When the contact hole 15a is opened, a part of the silicon oxide film 14 which is an underlayer of the contact hole 15a formed in the interlayer insulating film 15 is also removed simultaneously. Moreover, it is possible to make the silicon nitride film 13 which has an etching selectivity to the silicon oxide film which composes the interlayer insulating film 15 function as an etching stopper by selecting appropriately an etchant and a temperature condition when the etching are performed.

Next, the silicon nitride film 13 and the sidewall insulating film 10b which is exposed in the contact hole 15a are also removed by the etching. In this case, in order to be able to remove both the silicon nitride film 8b and the silicon oxide film 7b which compose the sidewall insulating film 10b, the etchant and the temperature condition can be appropriately selected when the etching are performed, not to have the etching selectivity to each other. In this case, it is possible to make the silicide layers 11b and 12b and the $P^-$ source/drain active layer 9b function as the etching stopper.

Next, a new $P^-$ active layer 16 is formed over the $P^+$ source/drain active layer 9b by the injection of the P type impurity ion in an adjacent part of the wiring 6c in the surface of the semiconductor substrate 1 which is exposed in the contact hole 15a. It is not necessary that the $P^+$ active layer 16 is formed over the $P^+$ source/drain active layer 9b, but it only has to be in contact with the $P^+$ source/drain active layer 9b.

Figure 6:
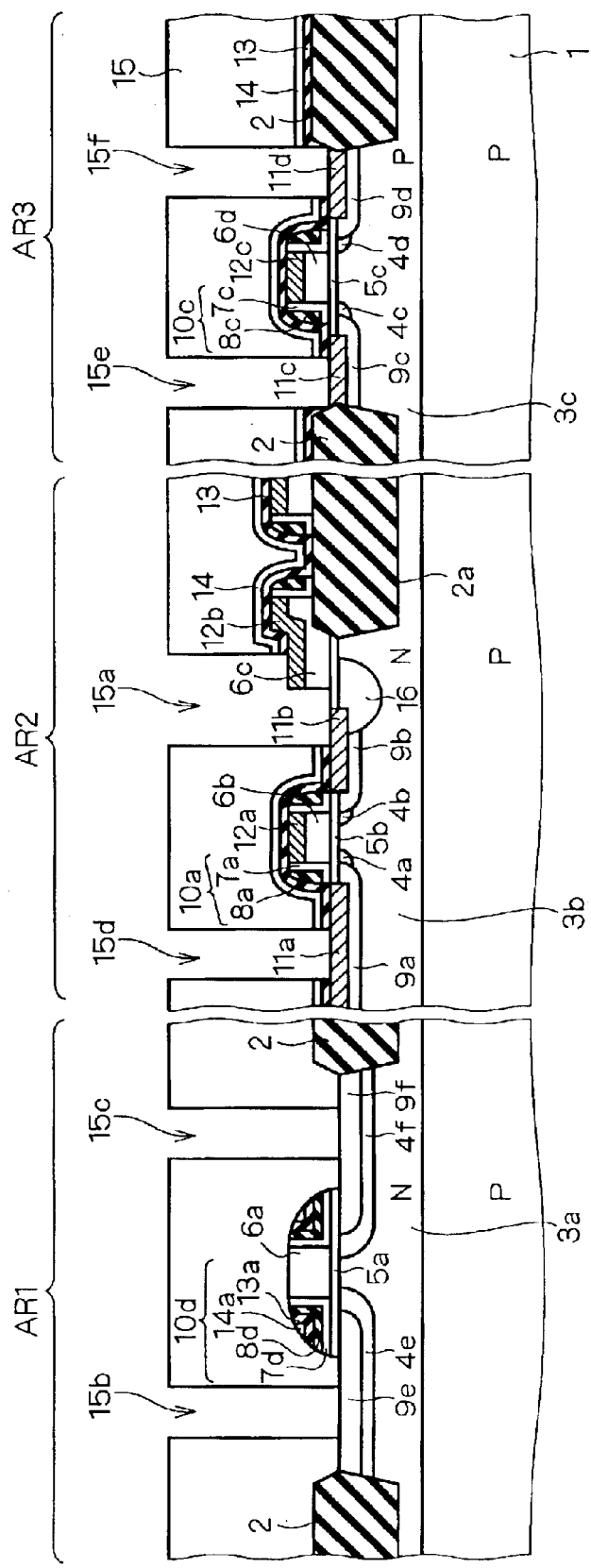

Further, as shown in FIG. 6, contact holes 15b to 15f which respectively connects with each of the source/drain active layers 9a and 9c to 9f are formed in the interlayer insulating film 15 by the photolithography technique and the etching technique. Also when the contact holes 15d to 15f are opened, in the same manner as the case of the contact hole 15a, it is possible to make the silicon nitride film 13 which has the etching selectivity to the silicon oxide film composing the interlayer insulating film 15 function as the etching stopper by selecting appropriately the etchant and the temperature condition when the etching are performed.

Figure 7:
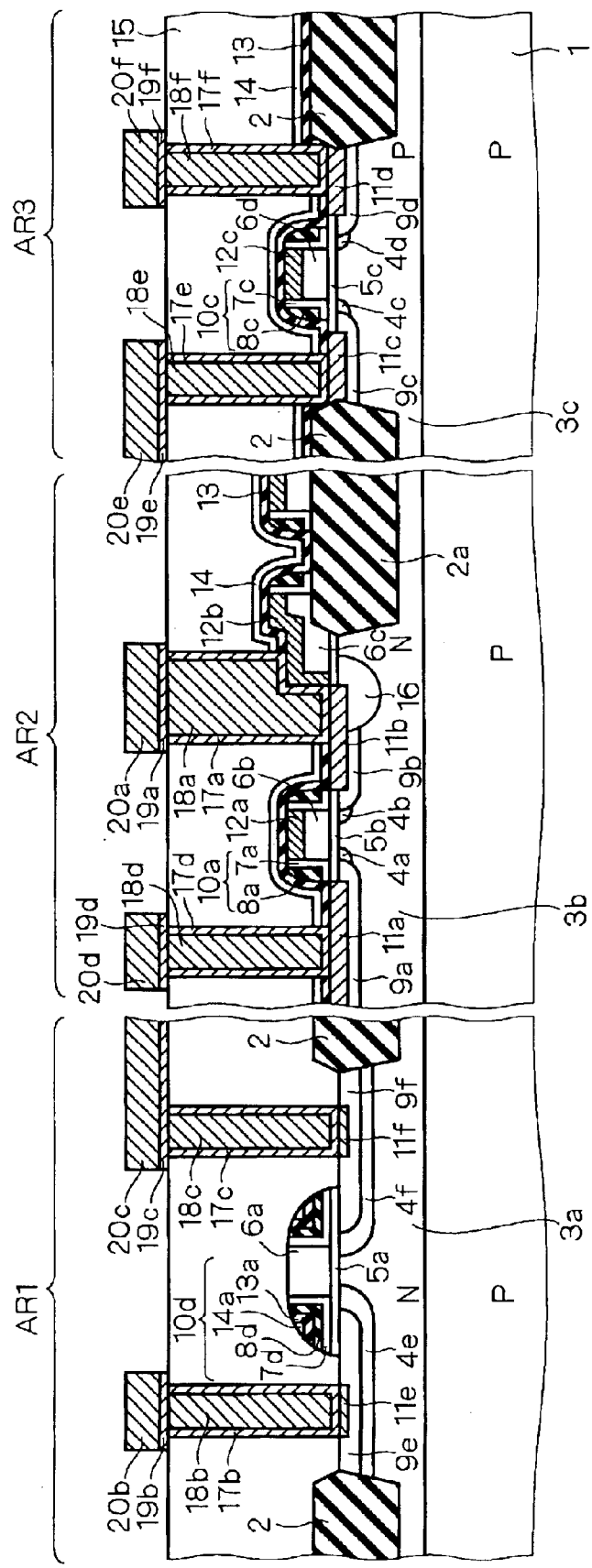

Next, with reference to FIG. 7, the metal film such as Ti etc. is formed on a surface of the interlayer insulating film 15 and a bottom surface and a side surface in the contact holes 15a to 15f by the sputtering method and the CVD method, and furthermore, the TiN film is formed on it by the sputtering method and the CVD method.

Further, silicide layers 11e and 11f are formed on parts which are exposed in the contact holes 15b and 15c in the $P^+$ source/drain active layers 9e and 9f of the high voltage circuit part AR1 by performing the annealing treatment in the ammonia atmosphere and making the metal film and the TiN film react to a silicon material. Not shown in FIG. 7, in this time, also in the N channel MOS transistor of the high voltage circuit part AR1, the silicide layer is formed on a part which is exposed in the contact hole in the $N^+$ source/drain active layer.

In this time, the silicide layer is also formed on a part of non-silicidation in a surface of the $P^+$ active layer 16 which is exposed in the contact hole 15a and a part of non-silicidation in a side surface of the wiring 6c. According to this, the silicide layer 11b already formed and the silicide layer newly formed on the surface of the $P^+$ active layer 16 join each other and thus a region of the silicide layer 11b is enlarged to an adjacent part of the wiring 6c, and the silicide layer 12b already formed and the silicide layer newly formed on a part of the side surface of the wiring 6c join each other and thus a region of the silicide layer 12b is enlarged to a surface part of the semiconductor substrate 1.

With regard to the other contact holes 15d to 15f where the silicide layer has already been formed on their bottom surface, there is scarcely a reaction of the silicidation.

When the Ti metal film is annealed in the ammonia atmosphere, it transforms into the TiN film, thus the TiN film is formed on the side surface of the contact holes 15a to 15f and the surface of the interlayer insulating film 15. When the CMP process is performed on the surface of the interlayer insulating film 15 here. TiN films 17a to 17f remain only on the side surface of the contact holes 15a to 15f.

Co can be applied as the metal film instead of Ti, however, it is preferable to perform the annealing treatment in an Ar atmosphere in that case. In this case, the silicidation can be proceeded with regard to the surface of the semiconductor substrate 1 and the side surface of the wiring 6c such as the silicide layers 11e, 11f etc., however, Co on the side surface of the contact holes 15a to 15f and on the surface of the interlayer insulating film 15 remains unreacted. Thus, the unreacted Co is removed by a certain chemical (which enables the Co silicide to remain), and then the TiN film is newly formed by the sputtering method and the CVD method. Further, when the CMP process is performed on the surface of the interlayer insulating film 15, the TiN films 17a to 17f remain only on the side surface of the contact holes 15a to 15f.

Further, the metal film such as W etc. is formed by the sputtering method and the CVD method and is filled in the contact holes 15a to 15f enough. Further, the surface of the interlayer insulating film 15 is flattened by the CMP process, and contact plugs 18a to 18f are formed in the contact holes 15a to 15f.

Further, the TiN film and the metal film such as W etc. are laminated on the surface of the interlayer insulating film 15 which is flattened. Further, this laminating film is patterned by the photolithography technique and the etching technique, and wirings composed of each laminating structure of TiN films 19a to 19f and metal films 20a to 20f are formed.

According to the manufacturing method of the semiconductor device according to the present preferred embodiment, the contact hole 15a in which both the $P^+$ source/drain active layer 9b and the wiring 6c are exposed is formed. And the P+ active layer 16 is formed which is at least in contact with the P+ source/drain active layer 9b on the adjacent part of the wiring 6c in the surface of the semiconductor substrate 1 which is exposed in the contact hole 15a. By reason of forming the P− active layer 16, when the metal film such as W etc. is filled in the contact hole 15a and the shared contact plug 18a conductive to both the P+ source/drain active layer 9b and the wiring 6c is formed, the contact resistance between the shared contact plug 18a and the P− source/drain active layer 9b can be reduced than ever.

In the present preferred embodiment, when the contact hole 15a is formed, the sidewall insulating film 10b is removed. When the sidewall insulating film 10b is removed, the semiconductor substrate 1 which is a part under the sidewall insulating film 10b is liable to be damaged, however in the present preferred embodiment, the P+ active layer 16 is formed, thus the P+ source/drain active layer 9b can be regarded as a new active layer which is incorporated with the P+ active layer 16. According to this, a PN junction between the active layer and the semiconductor substrate 1 can be definitely formed, and an effect upon an electrical characteristic by the damage of the semiconductor substrate 1 can be reduced. As a result, an increase of a junction leakage current can be suppressed, and thus a semiconductor device which has little deterioration of the electrical characteristic can be obtained, even if it has a structure that the sidewall insulating film in the shared contact plug part is removed.

Furthermore, according to the manufacturing method of the semiconductor device according to the present preferred embodiment, the MOS transistor TR3 of the high voltage circuit part AR1 and the MOS transistors TR1 and TR2 of the memory cell part AR2 and the memory cell peripheral circuit part AR3 can be manufactured. Moreover, the sidewall insulating films 10a to 10c are formed by the etch-back of the silicon nitride film 8, and the sidewall insulating film 10d is formed by the etch-back of the laminating structure of the silicon nitride film 8 and the silicon oxide film 14.

Thus, the sidewall insulating film 10d on which the silicon oxide film 14 is laminated moreover has a wider width than the sidewall insulating films 10a to 10c, and the forming width of the sidewall insulating film between the MOS transistor TR3 and the MOS transistors TR1 and TR2 can be changed. In other words, the MOS transistor TR3 which includes the sidewall insulating film 10d can be applied to the high voltage circuit part, the MOS transistors TR1 and TR2 which include the sidewall insulating films 10a and 10c can be applied to the memory cell, and thus the manufacturing method of the semiconductor device which is suited for forming the transistor for the memory cell and the transistor for the high voltage circuit part on one semiconductor substrate can be obtained.

Furthermore, according to the semiconductor device according to the present preferred embodiment, by reason that the width of the sidewall insulating film 10d is larger than the widths of the sidewall insulating films 10a to 10c, in the transistor TR3, the source/drain active layer can be formed in the position more distant from the gate electrode, as compared with in the MOS transistors TR1 and TR2. Thus, the semiconductor device which is suited for forming the transistor for the memory cell and the transistor for the high voltage circuit part on one semiconductor substrate can be obtained.

Furthermore, according to the manufacturing method of the semiconductor device according to the present preferred embodiment, the silicon nitride film 8 and the silicon oxide film 14 are applied as a material of the sidewall insulating film. By reason that the silicon nitride film which enables prevention of a movement of metallic atoms etc. is included in all of the sidewall insulating films 10a to 10d, an entrance of the metallic atoms etc. to the gate electrodes of respective transistors from the contact plugs 18a to 18f which are connected with respective source/drain active layers can be prevented.

The silicon nitride films 8a to 8d which compose the sidewall insulating films 10a to 10d have an etching selectivity to the interlayer insulating film 15 which is the silicon oxide film, thus even if a slippage of an alignment occurs when each contact hole is formed in the interlayer insulating film 15, the sidewall insulating films 10a to 10d are hard to be removed.

In the meantime, the sidewall insulating film 10d has the wide width by laminating the silicon oxide film 14a on the silicon nitride film 8d. Thus, the laminating part of the sidewall insulating film 10d is made of the same material as the interlayer insulating film 15, and when each contact plug is formed in the interlayer insulating film 15, the part of the silicon oxide film 14a in the sidewall insulating film 10d can also be removed at the same time. Thereupon, in case that the plural MOS transistors are formed proximately in the high voltage circuit part AR1, the contact plug is easy to be formed between the gate electrodes, even if the distance between the gate electrodes becomes short with an advance of a minuteness.

Second Preferred Embodiment

The present preferred embodiment is a modification example of the manufacturing method of the semiconductor device according to the first preferred embodiment, and also in the high voltage circuit part AR1, the sidewall insulating film which has the same structure as the sidewall insulating films 10a to 10c in the memory cell part AR2 and the memory cell peripheral circuit part AR3 is formed, and by laminating the insulating film moreover on the sidewall insulating film and performing the etch-back on this, the sidewall insulating film for the high voltage circuit part AR1 is formed.

At first, in the same manner as the case of the first preferred embodiment, the structure shown in FIG. 1 is prepared. Next, the silicon nitride film 8 is furthermore formed on the silicon oxide film 7 over the entire surface of the semiconductor substrate 1 so as to cover the semiconductor substrate 1, the gate electrodes 6a, 6b and 6d and the wiring 6c by the CVD method, for example.

Figure 8:
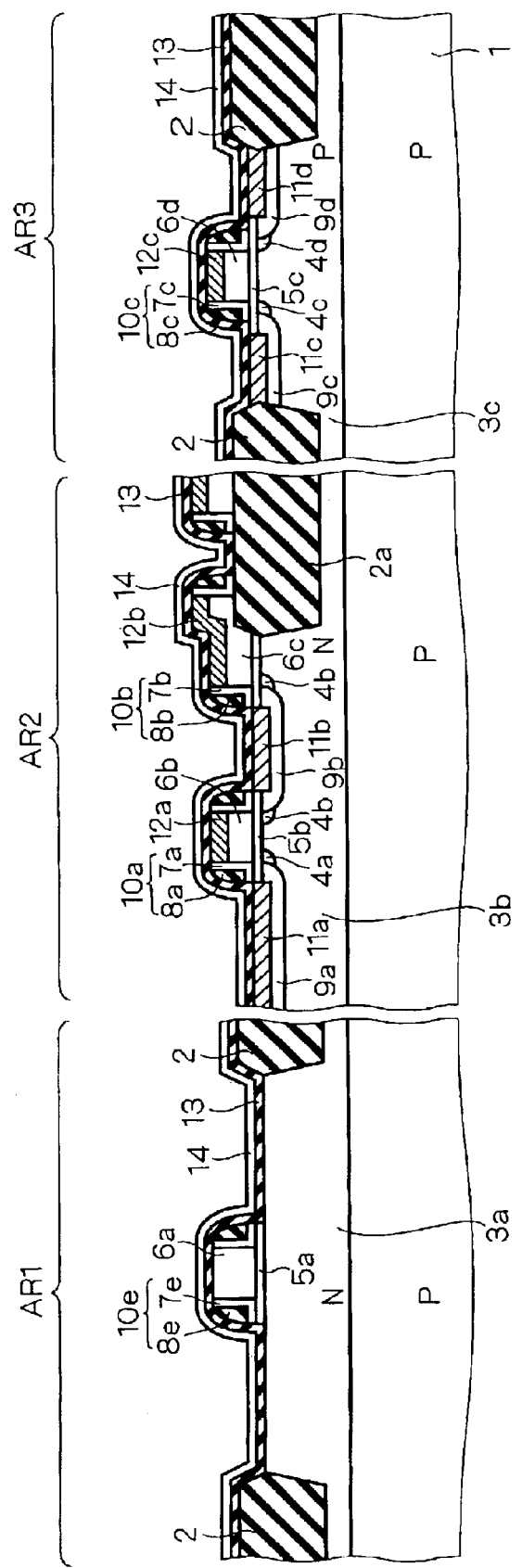
FIGS. 8 to 12 are drawings all illustrating a manufacturing method of a semiconductor device according to the second preferred embodiment.

Further, with reference to FIG. 8, the etch-back is performed on the silicon nitride film 8 and the silicon oxide film 7 in all the regions of the high voltage circuit part AR1, the memory cell part AR2 and the memory cell peripheral circuit part AR3. According to this, the sidewall insulating film 10a which includes the silicon nitride film 8a and the silicon oxide film 7a the sidewall insulating film 10b which includes the silicon nitride film 8b and the silicon oxide film 7b, the sidewall insulating film 10c which includes the silicon nitride film 8c and the silicon oxide film 7c and a sidewall insulating film 10e which includes a silicon nitride film 8e and a silicon oxide film 7e are formed in all the regions.

Further, the impurity injection is performed with the gate electrodes 6b and 6d, the wiring 6c and the sidewall insulating films 10a to 10c as the mask selectively in the memory cell part AR2 and the memory cell peripheral circuit part AR3. According to this, source/drain active layers 9a to 9d are formed in the semiconductor substrate 1, and the transistor TR1 for the memory cell and the transistor TR2 for the memory cell peripheral circuit are formed.

More particularly, in both regions, the P$^+$ source/drain active layers 9a and 9b are formed by injecting the P type impurity ion in the forming region of the P channel MOS transistor after the sidewall insulating films 10a and 10b are formed. In the meantime, the N$^+$ source/drain active layers 9c and 9d are formed by injecting the N type impurity ion in the forming region of the N channel MOS transistor after the sidewall insulating film 10c is formed. In this step, the photo resist is formed on the entire surface of the high voltage circuit part AR1, and in the high voltage circuit part AR1, the formation of the source/drain active layer is prevented.

Further, the metal film such as Ti and Co is formed on the entire surface of the semiconductor substrate 1 by the sputtering method, for example, and furthermore, the TiN film is formed on it by the sputtering method, for example.

Further, the suicide layers 11a to 11d and 12a to 12c are respectively formed on the gate electrodes 6b and 6d, the wiring 6c and the source/drain active layers 9a to 9d by performing the annealing treatment in the nitride atmosphere and making the metal film and the TiN film react to the silicon material. Afterwards, the unreacted metal film and TiN film are removed selectively. Also in this step, the photo resist is formed on the entire surface of the high voltage circuit part AR1 and the formation of the silicide layer in the high voltage circuit part AR1 is prevented.

Next, a silicon nitride film 13 and a silicon oxide film 14 are formed respectively laminating over the entire surface of the semiconductor substrate 1 so as to cover the silicon nitride film 7 in the high voltage circuit part AR1, and the entire surface of the memory cell part AR2 and the memory cell peripheral circuit part AR3 by the CVD method, for example.

Figure 9:
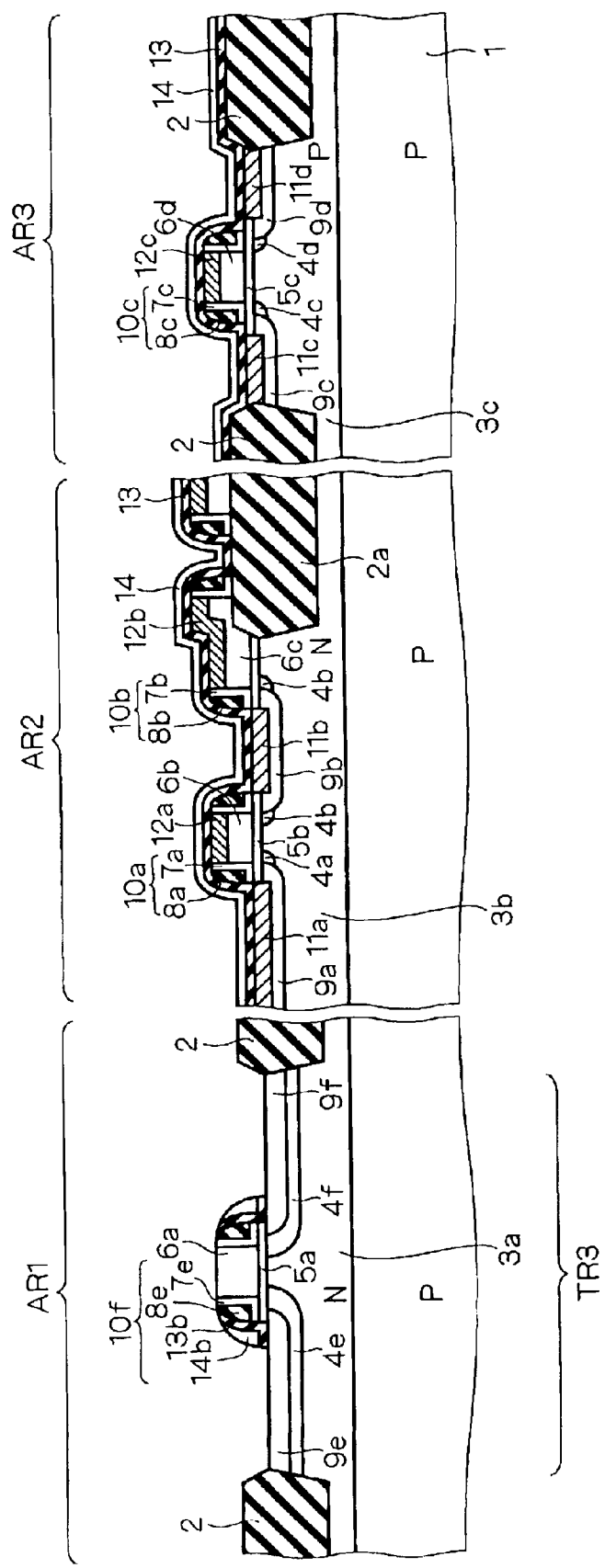

Further, the etch-back is performed to the laminating structure of the silicon nitride film 13 and the silicon oxide film 14 selectively in the high voltage circuit part AR1. According to this, as shown in FIG. 9, the sidewall insulating film 10f which includes the silicon oxide film 7e, the silicon nitride film 8e and 13b and the silicon oxide film 14b is formed on the side of the gate electrode 6a. In this step, the photo resist is formed on the entire surface of the memory cell part AR2 and the memory cell peripheral circuit part AR3, and in the memory cell part AR2 and the memory cell peripheral circuit part AR3, the etch-back to the silicon nitride film 13 and the silicon oxide film 14 is prevented.

Further, the impurity injections by two stages are performed with the gate electrode 6a and the sidewall insulating film 10f as the mask selectively in the high voltage circuit part AR1. In other words, both the formation of the extension region and the formation of the source/drain active layer are performed. According to this, the transistor TR3 for the high voltage circuit part is formed in the semiconductor substrate 1.

More particularly, in the high voltage circuit part AR1. P$^-$ extension regions 4e and 4f are formed by injecting the P type impurity ion in the forming region of the P channel MOS transistor. Afterwards, P$^+$ source/drain active layers 9e and 9f are formed within the forming region of the P$^-$ extension regions 4e and 4f by the injection of the P type impurity ion whose concentration is raised. The N channel MOS transistor is not shown in the high voltage circuit part AR1, however, in the same manner as the case of the P channel MOS transistor, the injection of the N type impurity ion by two stages can be performed with the gate electrode and the sidewall insulating film as the mask.

Also in this step, the photo resist is formed on the entire surface of the memory cell part AR2 and the memory cell peripheral circuit part AR3, and in the memory cell part AR2 and the memory cell peripheral circuit part AR3, the formation of the extension region and the source/drain active layer is prevented.

Figure 10:
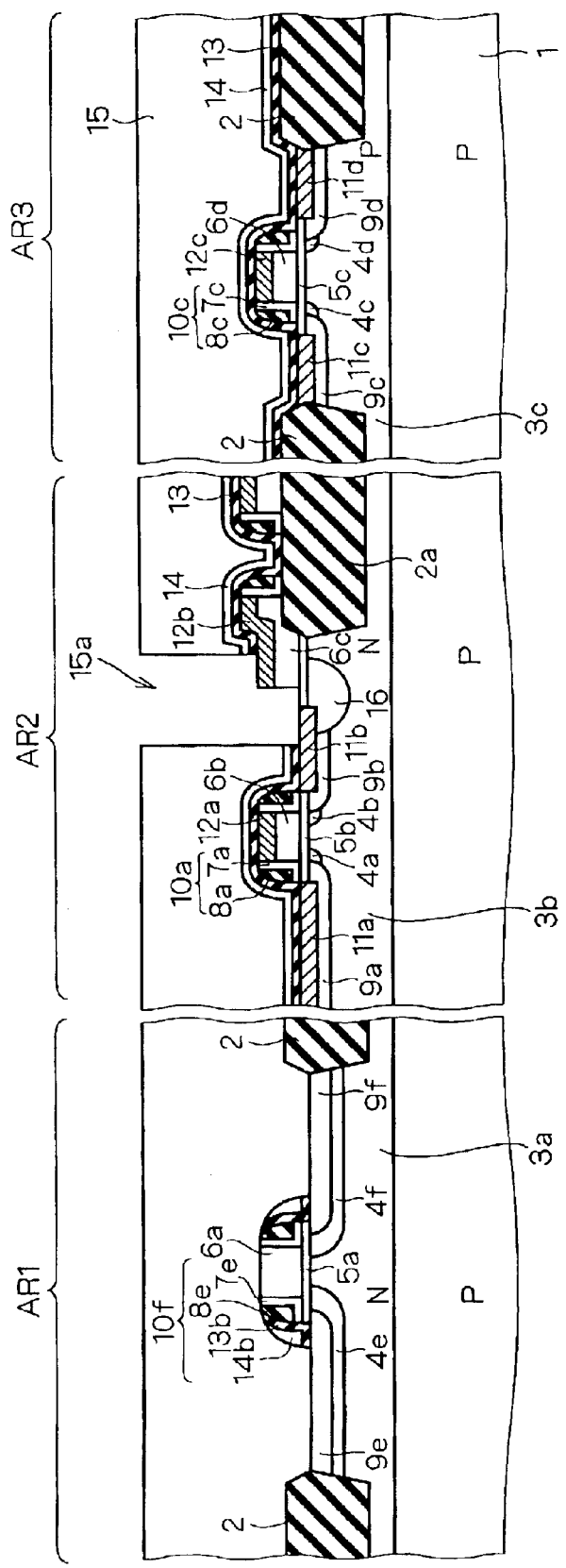

Next, with reference to FIG. 10, the interlayer insulating film 15 which is composed of, for example, the silicon oxide film is formed on the surface of the semiconductor substrate 1 by the CVD method. The surface of the interlayer insulating film 15 is flattened by the CMP process etc.

Afterwards, in the same manner as the case of the preferred embodiment 1, the contact hole 15a is formed in the interlayer insulating film 15 by the photolithography technique and the etching technique. Further, the sidewall insulating film 10b is removed by the etching. The new P$^+$ active layer 16 is also formed over the P$^+$ source/drain active layer 9b.

Figure 11:
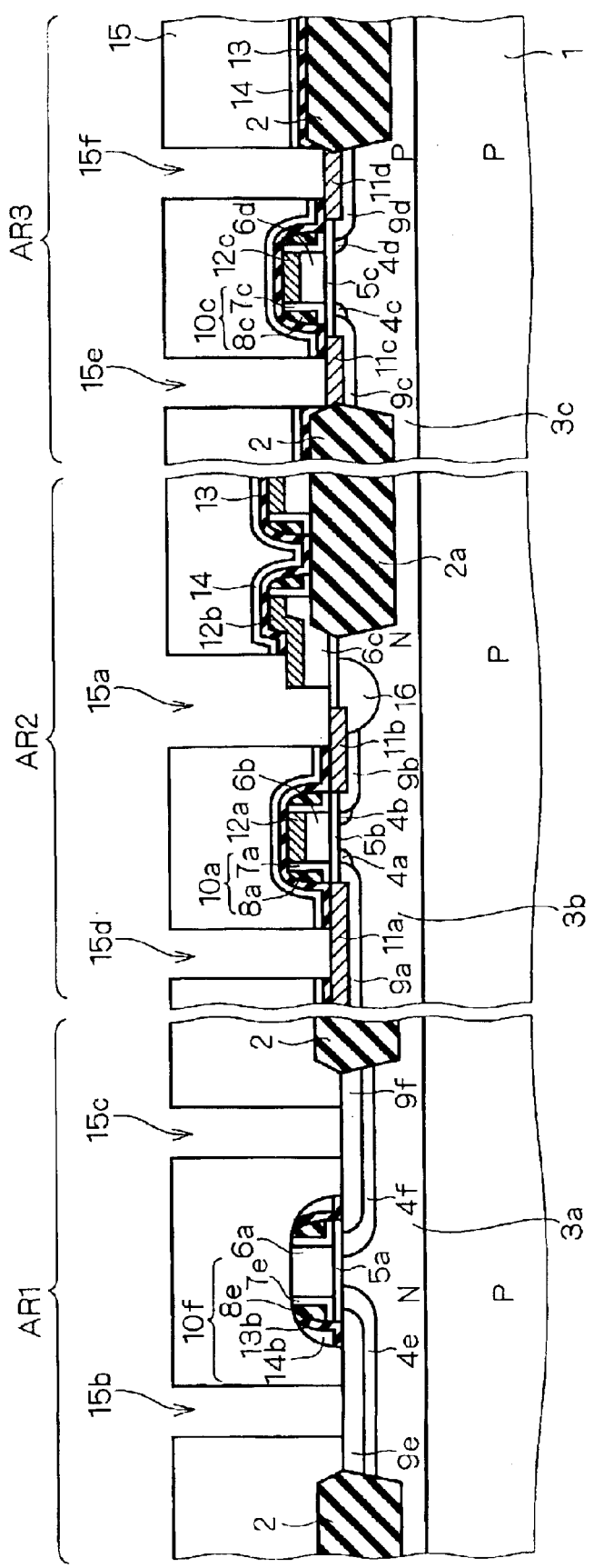
Figure 12:
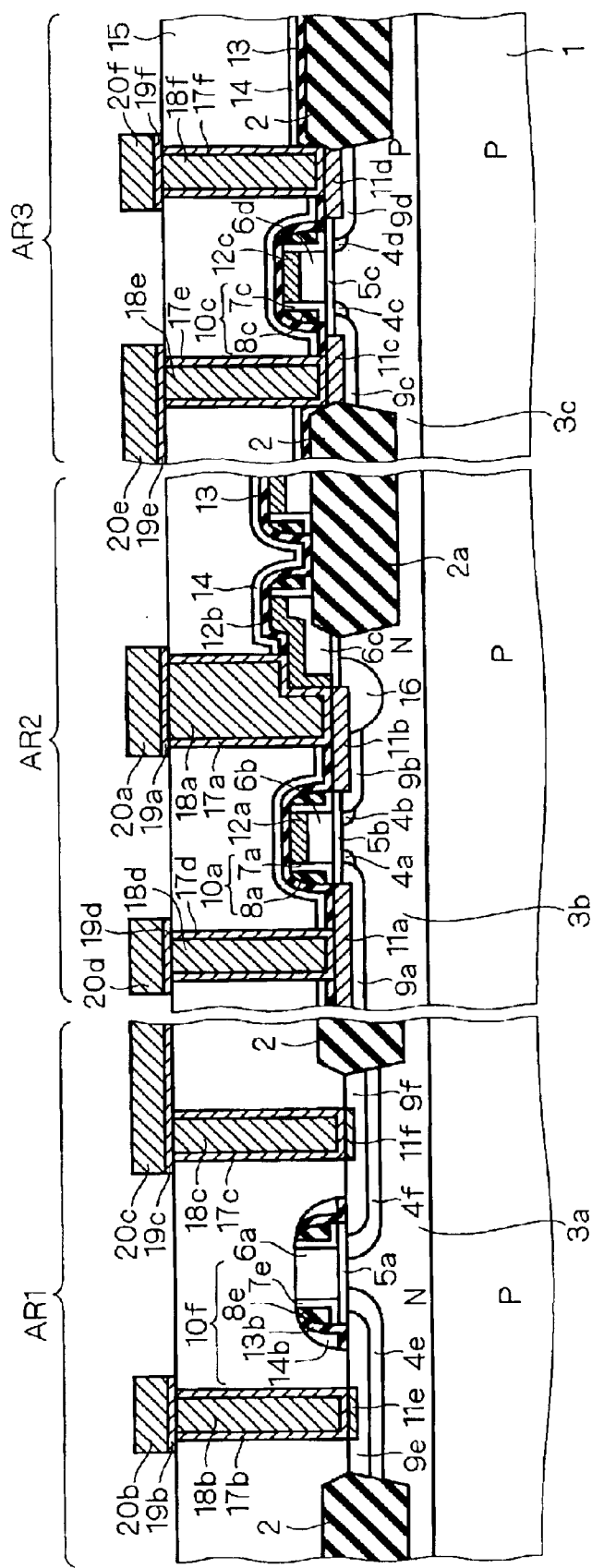

Further, as shown in FIG. 11, the contact holes 15b to 15f are formed in the interlayer insulating film 15 by the photolithography technique and the etching technique. Furthermore, as shown in FIG. 12, in the same manner as the case of the preferred embodiment 1, the silicide layers 11e and 11f, the TiN films 17a to 17f, the contact plugs 18a to 18f, the TiN films 19a to 19f and the metal films 20a to 20f are formed.

Also in the present preferred embodiment, the sidewall insulating film 10f on which the laminating structure of the silicon nitride film 13b and the silicon oxide film 14b is laminated moreover has a wider width than the sidewall insulating films 10a to 10c, and the forming width of the sidewall insulating film between the MOS transistor TR3 and the MOS transistors TR1 and TR2 can be changed. In other words, the MOS transistor TR3 which includes the sidewall insulating film 10f can be applied to the high voltage circuit part, the MOS transistors TR1 and TR2 which includes the sidewall insulating films 10a and 10c can be applied to the memory cell, and thus the manufacturing method of the semiconductor device which is suited for forming the transistor for the memory cell and the transistor for the high voltage circuit part on one semiconductor substrate can be obtained.

The other effect is the same as that of the first preferred embodiment.

The Others

With regard to the preferred embodiment described above, the polysilicon film is illustrated by example as the material of the gate electrodes 6a, 6b and 6d and the wiring 6c, and moreover, the silicide layer is formed on the gate electrodes 6b and 6d and the wiring 6c in the regions of the memory cell part AR2 and the memory cell peripheral circuit part AR3.

Figure 13:
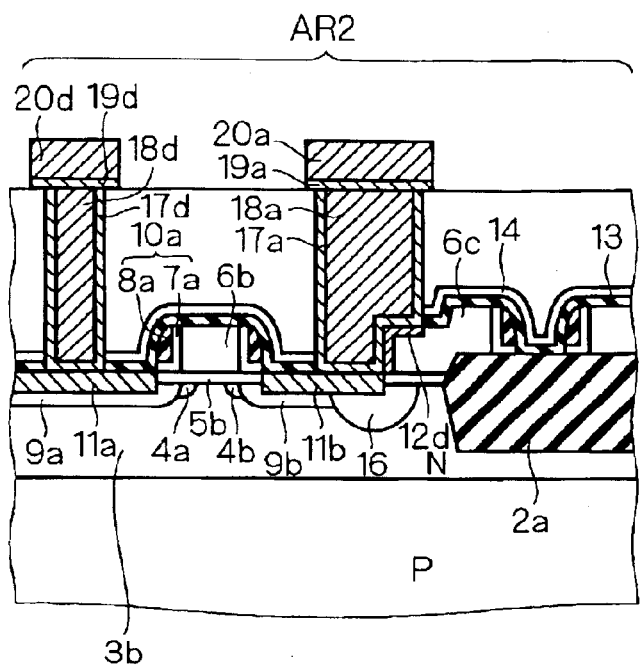
FIGS. 13 and 14 are drawings both illustrating a modification example of the semiconductor device according to the first or second preferred embodiment.
Figure 14:
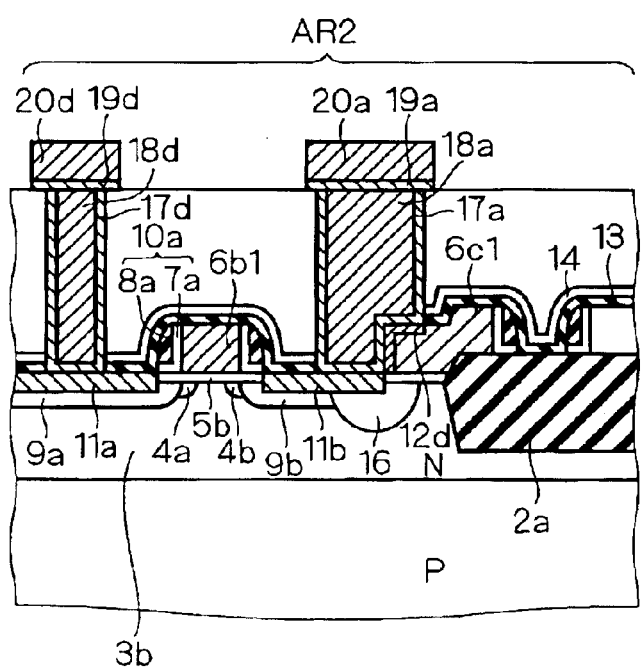

However, as a matter of course, the present invention is not limited to have such a structure of the gate electrode and the wiring, but as shown in FIG. 13, it can also have a structure that the silicide layer is not formed and as shown in FIG. 14, it can also have a structure that the gate electrode 6b1 and the wiring 6c1 which are formed of the metal film such as Ti, Co, W etc. instead of the polysilicon film are included, for example.

Otherwise, the present invention can also have a structure that the silicide layer is moreover formed on the gate electrode 6b1 and the wiring 6c1 of the metal film in FIG. 14 and that the silicide layer of each source/drain active layer is omitted (none of them are illustrated.)

In FIGS. 13 and 14, only the memory cell part AR2 is illustrated to simplify the drawings, however, the structure of the gate electrode and the wiring is also the same with regard to the other regions.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a semiconductor device, comprising the steps of:

(a) forming a conductive film on a semiconductor substrate;

(b) patterning said conductive film by a photolithography technique and an etching technique;

(c) forming a first active layer by performing an impurity injection in proximity of said patterned conductive film in a surface of said semiconductor substrate;

(d) forming an interlayer insulating film on a surface of said semiconductor substrate;

(e) forming a contact hole in which both said first active layer and said conductive film are exposed in said interlayer insulating film by a photolithography technique and an etching technique;

(f) forming a second active layer by performing an impurity injection on a surface of said semiconductor substrate which is exposed in said contact hole; and (g) forming a sidewall insulating film on a side of said conductive film after said step (b) before said step (c), wherein in said step (c), said first active layer is formed by performing an impurity injection with said sidewall insulating film and said conductive film as masks and in said step (e), furthermore, said sidewall insulating film which is exposed in said contact hole is removed.

* * * * *

UNITED STATES PATENT AND TRADEMARK OFFICE
CERTIFICATE OF CORRECTION

PATENT NO.    : 6,770,522 B2
DATED         : August 3, 2004
INVENTOR(S)   : Okumura et al.

It is certified that error appears in the above-identified patent and that said Letters Patent is hereby corrected as shown below:

Title page, Item [54] and Column 1, lines 1-2,
Title, should read:

-- SEMICONDUCTOR MANUFACTURING METHOD INCLUDING FORMING ADDITIONAL ACTIVE LAYER --

Signed and Sealed this

Seventh Day of December, 2004

JON W. DUDAS
*Director of the United States Patent and Trademark Office*